(12) United States Patent
Chidambarrao et al.

(10) Patent No.: US 7,843,024 B2
(45) Date of Patent: Nov. 30, 2010

(54) METHOD AND STRUCTURE FOR IMPROVING DEVICE PERFORMANCE VARIATION IN DUAL STRESS LINER TECHNOLOGY

(75) Inventors: Dureseti Chidambarrao, Weston, CT (US); Brian J. Greene, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 165 days.

(21) Appl. No.: 12/328,358

(22) Filed: Dec. 4, 2008

(65) Prior Publication Data

US 2009/0079011 A1    Mar. 26, 2009

Related U.S. Application Data

(63) Continuation of application No. 11/468,402, filed on Aug. 30, 2006, now Pat. No. 7,462,522.

(51) Int. Cl.
*H01L 29/82* (2006.01)
*H01L 21/338* (2006.01)

(52) U.S. Cl. .................... 257/418; 438/183
(58) Field of Classification Search ............. 438/53, 438/902, 158, 183; 257/254, 418, E21.453
See application file for complete search history.

(56) References Cited

U.S. PATENT DOCUMENTS

| 3,602,841 | A | 8/1971 | McGroddy |
| 4,665,415 | A | 5/1987 | Esaki et al. |
| 4,853,076 | A | 8/1989 | Tsaur et al. |
| 4,855,245 | A | 8/1989 | Neppl et al. |
| 4,952,524 | A | 8/1990 | Lee et al. |
| 4,958,213 | A | 9/1990 | Eklund et al. |
| 5,006,913 | A | 4/1991 | Sugahara et al. |
| 5,060,030 | A | 10/1991 | Hoke et al. |

(Continued)

FOREIGN PATENT DOCUMENTS

JP        64-76755        3/1989

OTHER PUBLICATIONS

Kern Rim, et al., "Transconductance Enhancement in Deep Submicron Strained-Si n-MOSFETs". International Electron Devices Meeting, 26, 8, 1, IEEE, Sep. 1998.

(Continued)

*Primary Examiner*—Calvin Lee
(74) *Attorney, Agent, or Firm*—Scully, Scott, Murphy & Presser, P.C.; Joseph P. Abate, Esq.

(57) ABSTRACT

A method and semiconductor structure that overcome the dual stress liner boundary problem, without significantly increasing the overall size of the integrated circuit, are provided. In accordance with the present invention, the dual stress liner boundary or gap therebetween is forced to land on a neighboring dummy gate region. By forcing the dual stress liner boundary or gap between the liners to land on the dummy gate region, the large stresses associated with the dual stress liner boundary or gap are transferred to the dummy gate region, not the semiconductor substrate. Thus, the impact of the dual stress liner boundary on the nearest neighboring FET is reduced. Additionally, benefits of device variability and packing density are achieved utilizing the present invention.

28 Claims, 8 Drawing Sheets

U.S. PATENT DOCUMENTS

| | | | |
|---|---|---|---|
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Myers et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,621,392 B1 | 9/2003 | Volant et al. |
| 6,635,506 B2 | 10/2003 | Volant et al. |
| 6,653,678 B2 | 11/2003 | Chidambarrao et al. |
| 6,717,216 B1 | 4/2004 | Doris et al. |
| 6,825,529 B2 | 11/2004 | Chidambarrao et al. |
| 6,831,292 B2 | 12/2004 | Currie et al. |
| 6,869,866 B1 | 3/2005 | Chidambarrao et al. |
| 6,872,620 B2 | 3/2005 | Chidambarrao et al. |
| 6,887,751 B2 | 5/2005 | Chidambarrao et al. |
| 6,890,808 B2 | 5/2005 | Chidambarrao et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 7,052,946 B2 | 5/2006 | Chen et al. |
| 7,115,954 B2 * | 10/2006 | Shimizu et al. ............. 257/369 |
| 7,462,522 B2 * | 12/2008 | Chidambarrao et al. ..... 438/183 |
| 2001/0004122 A1 | 6/2001 | Ito |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0013259 A1 | 1/2003 | Chidambarrao et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0201480 A1 | 10/2003 | Chidambarrao et al. |
| 2004/0029323 A1 | 2/2004 | Shimizu et al. |
| 2004/0113174 A1 | 6/2004 | Chidambarrao et al. |
| 2004/0113217 A1 | 6/2004 | Chidambarrao et al. |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0054148 A1 | 3/2005 | Chidambarrao et al. |
| 2005/0059201 A1 | 3/2005 | Chidambarrao et al. |
| 2005/0064646 A1 | 3/2005 | Chidambarrao et al. |
| 2005/0064687 A1 | 3/2005 | Chidambarrao et al. |
| 2005/0082616 A1 | 4/2005 | Chen et al. |
| 2005/0082634 A1 | 4/2005 | Doris et al. |
| 2005/0085022 A1 | 4/2005 | Chidambarrao et al. |
| 2005/0093030 A1 | 5/2005 | Doris et al. |
| 2005/0093059 A1 | 5/2005 | Belyansky et al. |
| 2005/0098829 A1 | 5/2005 | Doris et al. |
| 2005/0104131 A1 | 5/2005 | Chidambarrao et al. |
| 2005/0106799 A1 | 5/2005 | Doris et al. |
| 2005/0130358 A1 | 6/2005 | Chidambarrao et al. |
| 2005/0139930 A1 | 6/2005 | Chidambarrao et al. |
| 2005/0142788 A1 | 6/2005 | Chidambarrao et al. |
| 2005/0145950 A1 | 7/2005 | Chidambarrao et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0258515 A1 | 11/2005 | Chidambarrao et al. |
| 2005/0260808 A1 | 11/2005 | Xiangdong et al. |
| 2005/0269561 A1 | 12/2005 | Chidambarrao et al. |
| 2005/0280051 A1 | 12/2005 | Chidambarrao et al. |
| 2005/0282325 A1 | 12/2005 | Belyansky et al. |
| 2005/0285137 A1 | 12/2005 | Satoh |
| 2006/0027868 A1 | 2/2006 | Doris et al. |
| 2006/0046400 A1 | 3/2006 | Burbach et al. |
| 2006/0057787 A1 | 3/2006 | Doris et al. |
| 2006/0060925 A1 | 3/2006 | Doris et al. |
| 2006/0094193 A1 | 5/2006 | Horstmann et al. |
| 2007/0246741 A1 | 10/2007 | Sudo |
| 2007/0252230 A1 | 11/2007 | Zhu et al. |

OTHER PUBLICATIONS

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Nevel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitride Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for BilCMOS." IEEE Transactions of Electron Devices, vol. 41, No. 6, Jun. 1994, pp. 978-987.

M. Khater, et al., "SiGe HBT Technology with Fmax/Ft =350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Ouyang, et al., "Two-Dimensional Bandgap Engineering in a Novel Si/SiGe pMOSFET with Enhanced Device Performance and Scalability". 2000 IEEE, pp. 151-154.

Sheraw, C.D. et al., "Dual stress liner enhancement in hybrid orientation technology," VLSI Technology, 2005, Digest of Technical Papers, 2005 Symposium on Kyoto, Japan, Jun. 14-16, 2005, Piscataway, NJ, USA, IEEE, Jun. 14, 2005, pp. 12-13.

Yang, H.S. et al., "Dual stress liner for high performance sub-45nm gate length SOI CMOS manufacturing," Electron Devices Meeting, 2004, IEDM Technical Digest, IEEE International San Francisco, CA, USA Dec. 13-15, 2004, Piscataway, NJ, USA, IEEE, Dec. 13, 2004, pp. 1075-1077.

* cited by examiner

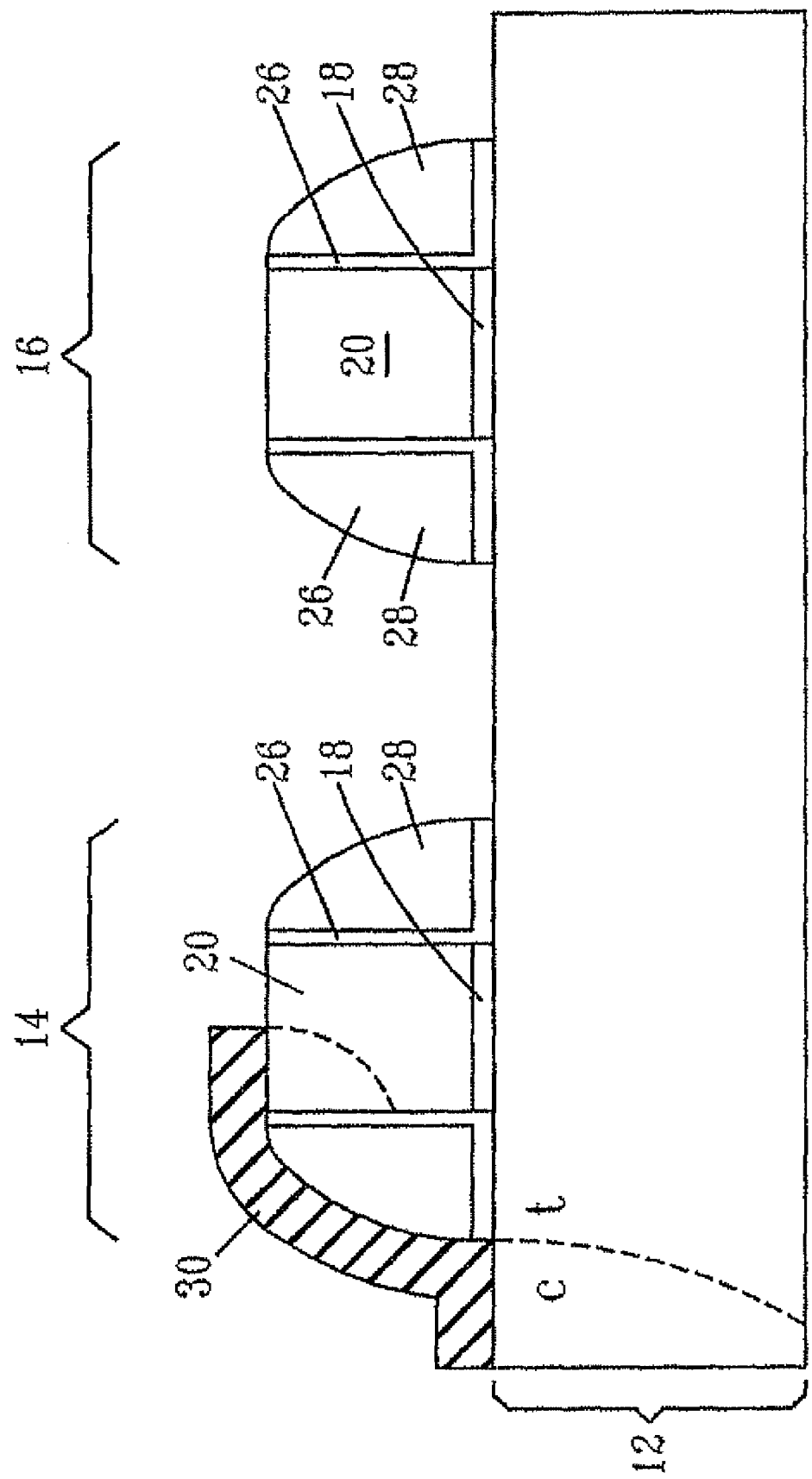

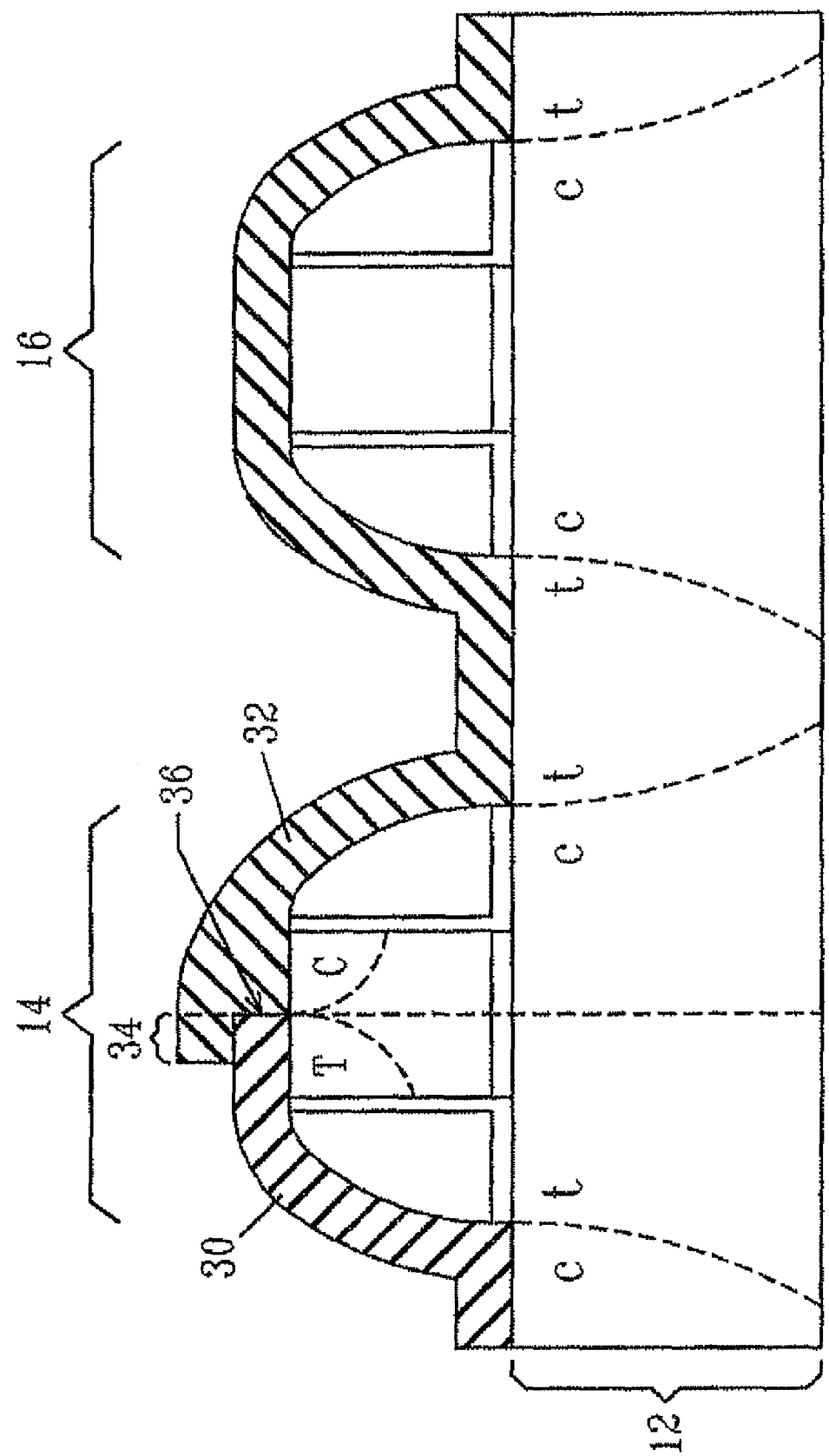

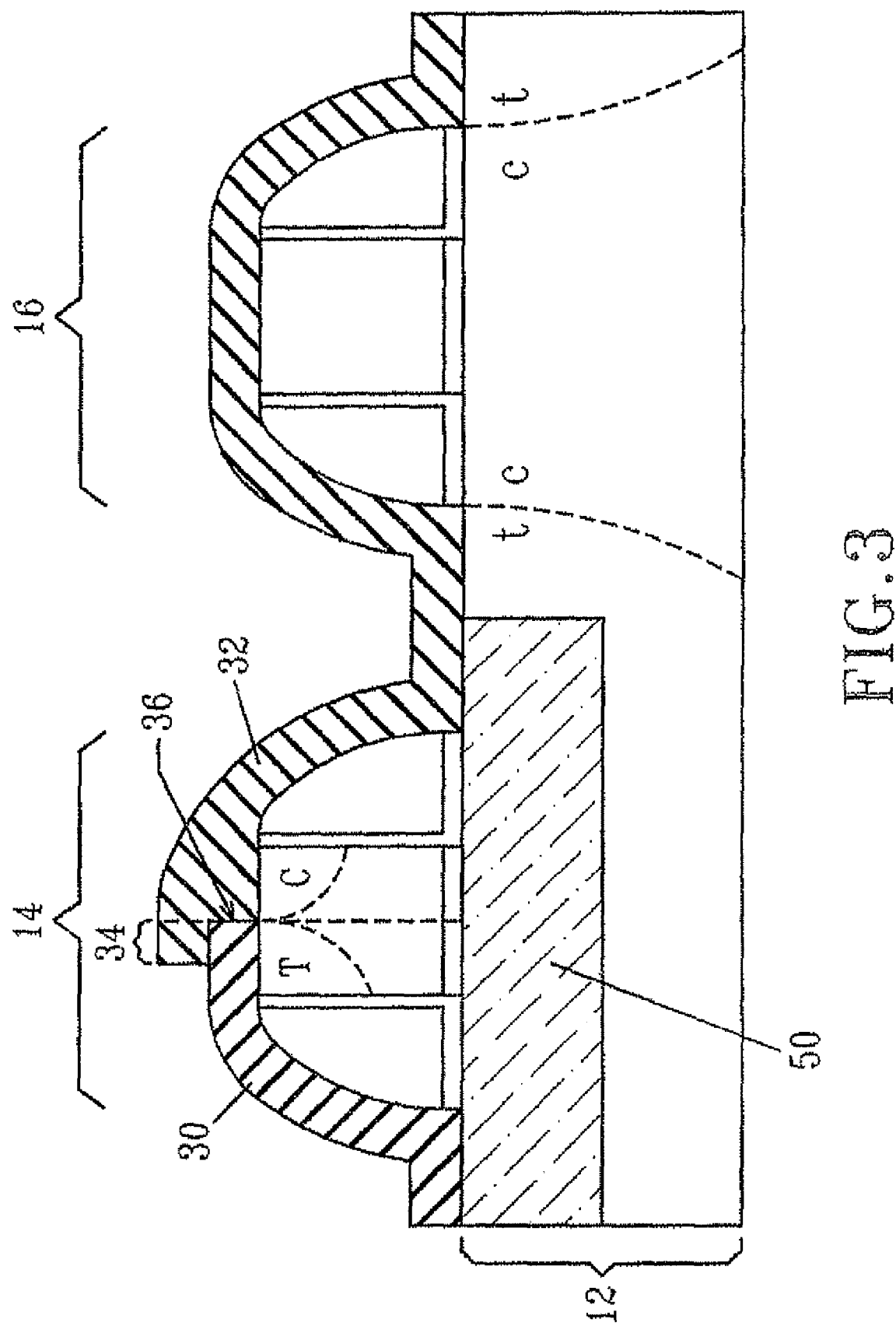

METHOD AND STRUCTURE FOR IMPROVING DEVICE PERFORMANCE VARIATION IN DUAL STRESS LINER TECHNOLOGY

RELATED APPLICATIONS

This application is a continuation of U.S. patent application Ser. No. 11/468,402, filed Aug. 30, 2006.

DESCRIPTION

1. Field of the Invention

The present invention relates to a semiconductor structure and a method of fabricating the same. More particularly, the present invention relates to a complementary metal oxide semiconductor (CMOS) structure that has improved device performance, which is obtained by using a modified dual stress liner technology. The present invention also provides a method of fabricating such a CMOS structure using the modified dual stress liner technology.

2. Background of the Invention

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits.

Since it has become increasingly difficult to improve MOSFETs and therefore CMOS performance through continued scaling, methods for improving performance without scaling have become critical. One approach for doing this is to increase carrier (electron and/or hole) mobilities. Increased carrier mobility can be obtained, for example, by introducing the appropriate stress/strain into the semiconductor lattice.

The application of stress changes the lattice dimensions of the semiconductor substrate. By changing the lattice dimensions, the electronic band structure of the material is changed as well. This results in changes in carrier transport properties such as carrier scattering rates and effective mass, which can be dramatic in certain cases. The application of physical stress (tensile or compressive) can be further used to enhance the performance of devices fabricated on the semiconductor substrates.

Compressive strain along the device channel increases drive current in p-type field effect transistors (pFETs) and decreases drive current in n-type field effect transistors (nFETs). Tensile strain along the device channel increases drive current in nFETs and decreases drive current in pFETs.

Stress can be introduced into a single crystal oriented substrate by several methods including, for example, forming a stress liner on top of the substrate and around the gate region. Depending on the conductivity type of the FET (i.e., p or n), the stress liner is optimally under tensile stress (preferred for nFETs) or compressive stress (preferred for pFETs). When nFETs and pFETs are integrated onto the same semiconductor substrate, dual stress liner technology is typically used in which a first stress liner under tensile stress is formed around each nFET, while a second stress liner under compressive stress is formed around each pFET. It is noted that the order of forming the stress liners may be variable. For example, the compressive stress liner may be formed prior to the tensile stress liner or visa versa.

However, the boundary between tensile and compressive stress liners in dual stress liner (DSL) technology also induces stress in the substrate, which can influence transistor performance as well. When the DSL boundary is in close proximity (with a lateral distance of about 5 microns or less) from an FET, and oriented parallel to the gate region, a degradation of the devices in proximity to the boundary has been observed. Degradation of 25% pFET and 18% nFET (saturation current at a fixed overdrive) have been demonstrated on recent CMOS structures, which is solely attributed to the DSL boundary influence mentioned above.

Reference is now made to FIGS. 1A-1D which illustrates the DSL boundary influence in greater detail for the case in which the tensile stress liner is formed prior to the formation of the compressive stress liner; in this case the compressive stress liner overlaps a portion of the tensile stress liner. FIG. 1A illustrates a portion of a non-stressed semiconductor substrate 100 that has a tensile stress liner 102 formed on a surface thereof. It is noted that no FET structures are shown in FIG. 1A since they lay to the periphery of the portion of the substrate 100 shown in FIG. 1A. The FETs are formed prior to disposing the tensile stress liner 102 on the substrate.

FIG. 1B illustrates the structure of FIG. 1A after patterning the tensile stress liner 102 by lithography and etching. As shown, an edge force 106 is created on the substrate 100. Moreover, the tensile stress liner 102 creates local stress in the substrate that decays with distance from the etched edge of the liner 102. In FIG. 1B, reference numeral 108 denotes a region of the substrate 100 under compression, while reference numeral 110 denotes a region of the substrate under tension. The dotted line (designated as 112) denotes a zero stress line.

FIG. 1C illustrates the structure of FIG. 1B after forming a compressive stress liner 114 thereon. The overlap region (i.e., boundary) 119 of the dual liners magnifies the edge force 106. Depending on the relative strengths of the tensile and compressive liners, the zero stress contour can take the form of 112, or either of the two other contours indicated by 112'.

FIG. 1D is an expanded view of FIG. 1C showing the presence of an FET 120 on a surface of the substrate 100. In this drawing, the substrate is under the following stresses (i) compression (c) under the FET 120 (from left spacer outer edge to right spacer outer edge), (ii) tension (t) beneath the compressive liner 114, and (iii) compression (c) under the tensile liner 102.

The problem with such a structure is that the dual stress liner boundary 119 is in longitudinal proximity to the FET 120 which results in substantial degradation of the performance of the FET. The term "longitudinal proximity" is used in the present application to denote that the dual stress liner boundary 119 is located at a distance lengthwise from the FET that is about 5 microns or less. This degradation is observed for both nFETs and pFETs. In particular, it was been found that the longitudinal stress, which is related to the dual stress liner boundary 119, reduces the stress in the FET channel.

One solution to this dual stress liner boundary problem is to design an integrated circuit in which the longitudinal boundaries are placed far away (a longitudinal distance of greater than 5 microns) from the FET devices. Although such a solution is feasible, it does come with an area penalty that increases the overall size of the integrated circuit. Such an increase in size contradicts the current trend in shrinking integrated circuits.

As such, a method is needed which overcomes the dual stress liner boundary problem without significantly increasing the overall size of the integrated circuit.

SUMMARY OF THE INVENTION

The present invention provides a method and semiconductor structure that overcomes the dual stress liner boundary problem, without significantly increasing the overall size of the integrated circuit. In accordance with a first embodiment of the present invention, the dual stress liner boundary or gap is forced to land on a neighboring dummy gate region. By forcing the dual stress liner boundary or gap to land on the neighboring dummy gate region, the large stresses associated with the dual stress liner boundary are transferred to the dummy gate material, not the semiconductor substrate. The dummy gate region may be located within an active area of the FET or it may be present atop an isolation region such as a trench isolation region. Thus, the impact of the dual stress liner boundary on the nearest neighboring FET is reduced. Additionally, benefits of device variability and packing density are achieved utilizing the present invention.

In general terms, the present invention provides, in a first embodiment, a semiconductor structure that includes:

a semiconductor substrate having at least one dummy gate region in proximity to at least one active gate region; and
a tensile stress liner and a compressive stress liner located on said substrate, wherein said tensile stress liner and said compressive stress liner are present at least in part over said at least one dummy gate region such that a boundary or gap that exits between the stress liners lands on top of said at least one dummy gate region.

The at least one active gate region may comprise at least one pFET or at least one nFET. Combinations of nFETs and pFETs are also contemplated. In accordance with the presence invention, the boundary or gap between the compressive stress liner and the tensile stress liner is such that it falls atop a dummy gate region that is in close proximity to each FET present on the substrate.

In accordance with the present invention, the compressive stress liner and the tensile stress liner may overlap each other, perfectly abut each other, or a gap may be present between the two liners. In accordance with the present invention the 'boundary' is created by the overlap or perfect abutment of the two stress liners, while the 'gap' is created by an underlap of the two stress liners.

In one preferred embodiment of the present invention, the inventive structure comprises:

a semiconductor substrate having at least one dummy gate region in proximity to at least one pFET; and
a tensile stress liner and a compressive stress liner located on said substrate, wherein said compressive stress liner covers the at least one pFET and is present at least in part over said at least one dummy gate region such that a boundary or gap exists between the stress liners that lands on top of said at least one dummy gate region.

In another preferred embodiment of the present invention, the inventive structure comprises:

a semiconductor substrate having at least one dummy gate region in proximity to at least one nFET; and
a tensile stress liner and a compressive stress liner located on said substrate, wherein said tensile stress liner covers the at least one nFET and is present at least in part over said at least one dummy gate region such that a boundary or gap exists between the stress liners that lands on top of said at least one dummy gate region.

In addition to the semiconductor structure described above, the present invention also provides a method of fabricating the same. In general terms, the method of the present invention includes:

providing a semiconductor substrate having at least one dummy gate region in proximity to at least one active gate region; and
disposing, in any order, a tensile stress liner and a compressive stress liner on said substrate, wherein said tensile stress liner and said compressive stress liner are present at least in part over said at least one dummy gate region such that a boundary or gap between the stress liners lands on top of said at least one dummy gate region.

In addition to using dual stress liners, the present application can also be applied to a semiconductor structure in which a single stress liner is present. In such an instance, the etched edge of the single stress liner is forced to land atop the dummy gate region of the structure.

BRIEF DESCRIPTION OF THE DRAWINGS

FIGS. 2A-2C are pictorial representations (through cross sectional views) depicting the modified dual stress liner technology provided by the present invention.

FIG. 3 is a pictorial representation (through a cross sectional view) depicting an alternative structure of the present application.

DETAILED DESCRIPTION OF THE INVENTION

The present invention which provides a method and structure for improving device performance utilizing a variation in the conventional dual stress liner technology, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

The present invention provides a method and structure in which a modified dual stress liner process is employed. The modified dual stress liner process of the present invention forces the dual stress liner boundary or gap to land on a dummy gate region that is in close proximity to an active gate region. By "dummy gate region", it is meant a non-active gate region that is typically not a functional transistor, and is typically formed to minimize the variability of nearby active gates. The term "active gate region" denotes a functional transistor gate. By close proximity" it is meant that the boundary between the dual stress liners is from about 5 microns or less from the active gate region.

Figure 2A:
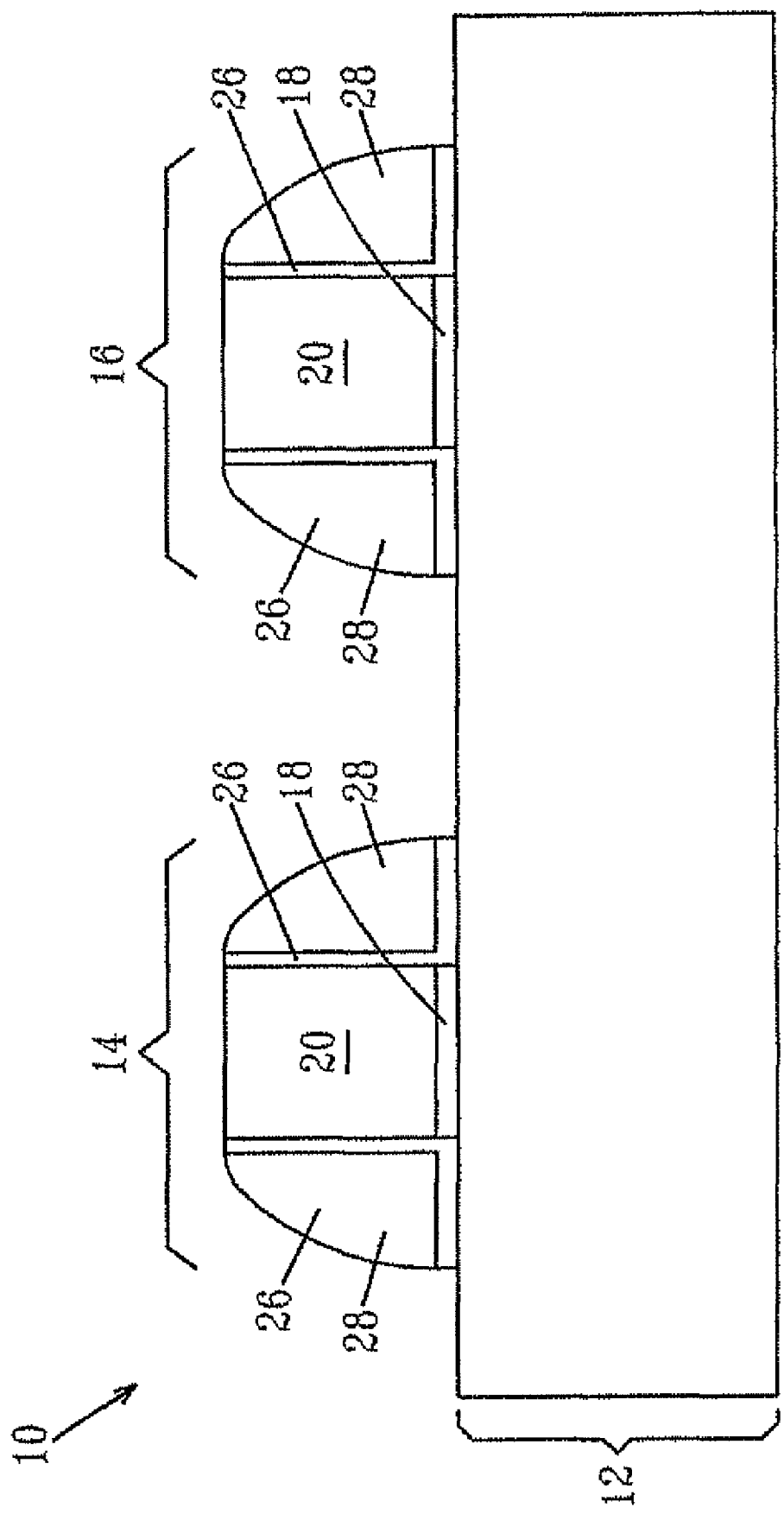

Reference is first made to FIG. 2A which illustrates an initial structure 10 that is employed in the present invention. As shown, the initial structure 10 includes a semiconductor substrate 12 having at least one dummy gate region 14 and at least one active gate region 16 in close proximity to each other. In accordance with the present invention, the dummy gate region 14 may be located atop an active region of the substrate as is shown in this drawing, or alternatively, the dummy gate may be located atop an isolation region present within or on the substrate.

The at least one active gate region 16 may be an nFET or a pFET. Combinations of pFETs and nFETs are also contemplated in the present invention.

Figure 1A:
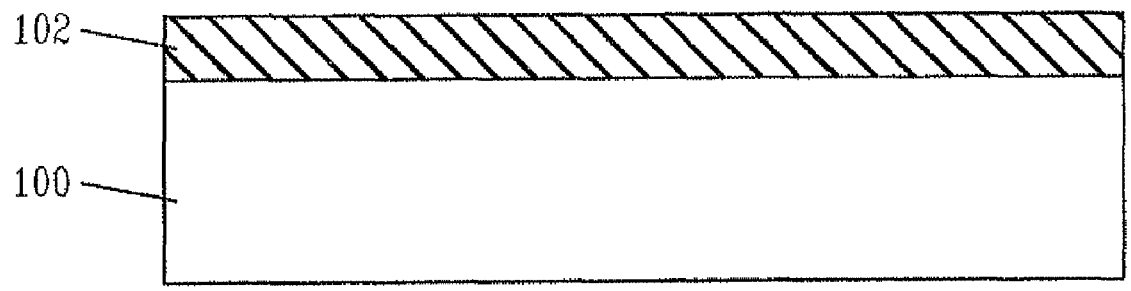
FIGS. 1A-1D are pictorial representations (through cross sectional views) depicting prior art dual stress liner technology.
Figure 1B:
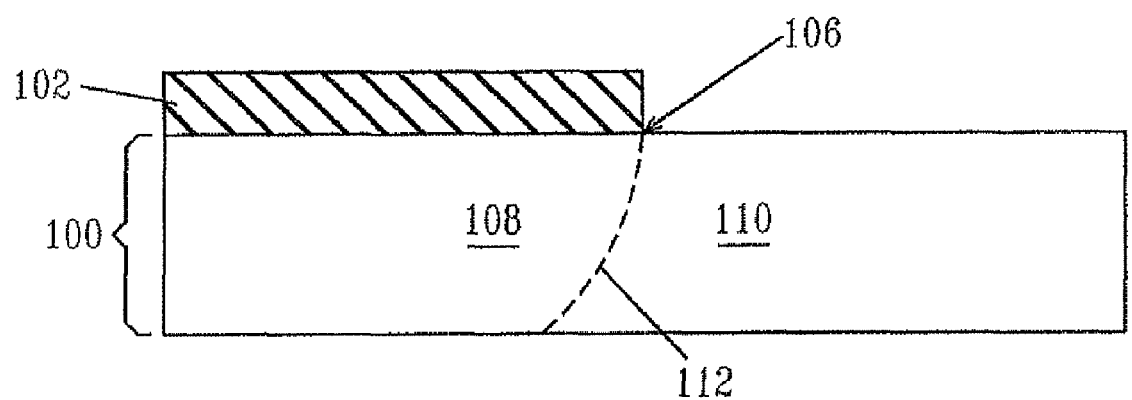
Figure 1C:
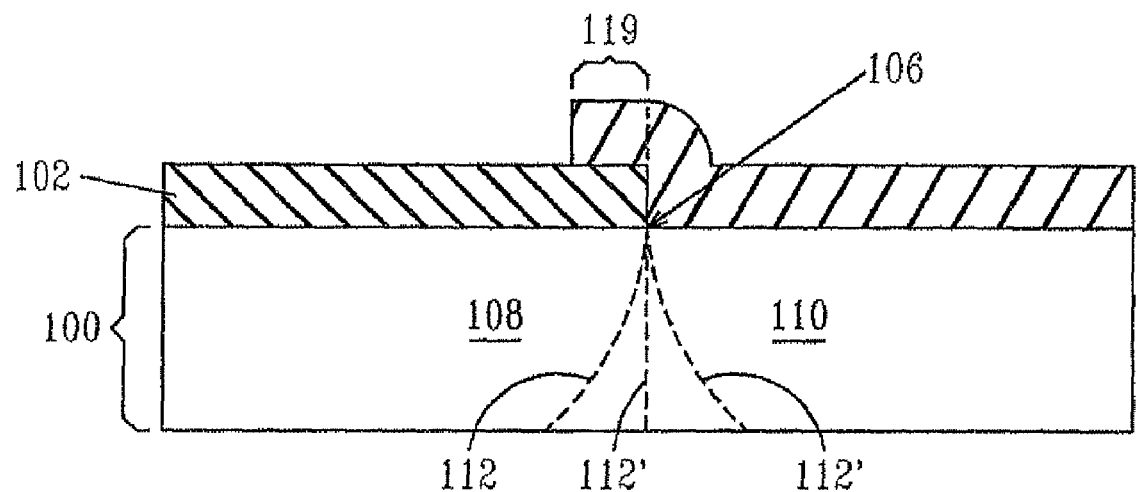
Figure 1D:
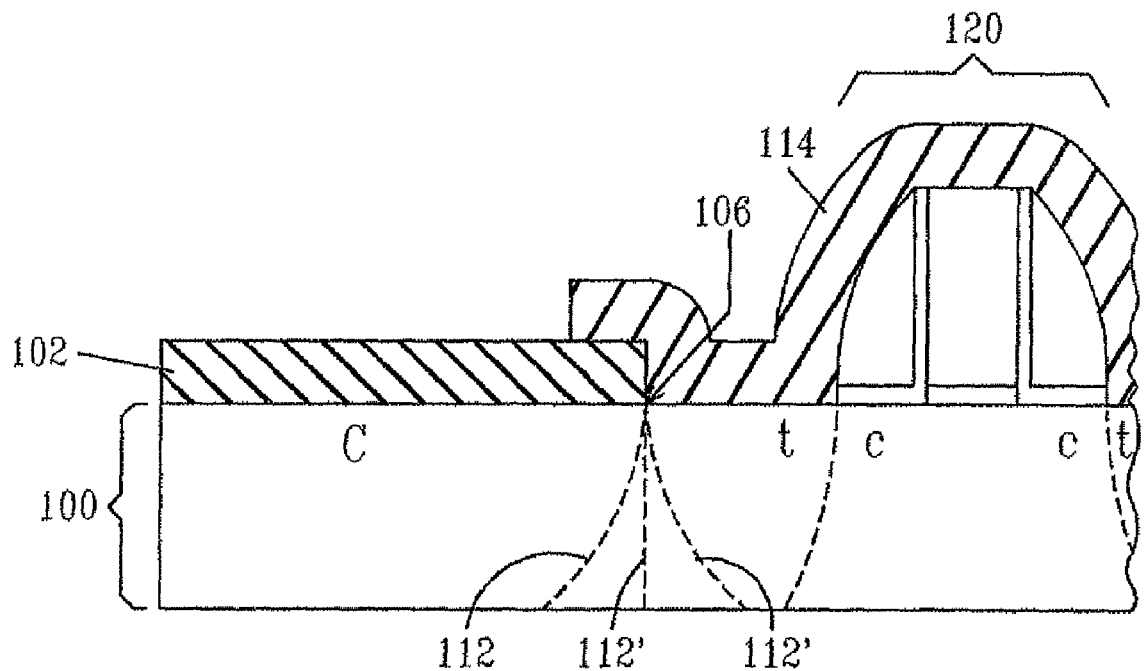

Each dummy gate region 14 and each active gate 16 present on the substrate 12 includes a gate dielectric 18 located on a surface of the substrate 12 and a gate electrode 20 located on the gate dielectric 20. Each active gate region 16 includes a channel region (not shown) located within the substrate 12 and beneath the gate dielectric/gate electrode stack. Source/drain regions (not shown) are located adjacent to the channel region in each of the active gate regions. Each dummy gate region 14 and active gate region 16 may also include at least one sidewall spacer. In FIG. 1A, a pair of sidewall spacers including an inner L-shaped spacer 26 and an outer spacer 28 is shown. The at least one sidewall spacer is optional, and need not be used in all instances.

The at least one dummy gate region 14 and the at least one active gate region 16 are fabricated using conventional complementary metal oxide semiconductor processing techniques well known to those skilled in the art. For example, deposition of various material layers, lithography, etching, ion implantation and annealing can be used in forming the active gate regions. The same processing steps can be used in forming the at least one dummy gate region 14. Each gate region (active and non-active) can also be formed utilizing a replacement gate process.

The semiconductor substrate 12 includes any semiconductor material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) are also contemplated herein. Typically, the semiconductor substrate 12 is a Si-containing semiconductor such as, for example, Si, SiC, SiGe, SiGeC, or a silicon-on-insulator. The substrate 12 may be unstrained, strained or include regions of strain and unstrain therein. The substrate 12 may be intrinsic or it may be doped with, for example, but not limited to: B, As or P.

When SOI substrates are employed, those substrates include top and bottom semiconductor, e.g., Si, layers that are separated at least in part by a buried insulating layer. The buried insulating layer includes, for example, a crystalline or non-crystalline oxide, nitride or any combination thereof. Preferably, the buried insulating layer is an oxide. Typically, the buried insulating layer is formed during initial stages of a layer transfer process or during an ion implantation and annealing process, such as, for example, SIMOX (separation by ion implantation of oxygen).

The substrate 12 may have a single crystal orientation or alternatively hybrid semiconductor substrates having surface regions of different crystal orientations can also be employed. The hybrid substrate allows for fabricating a FET upon a specific crystal orientation that enhances the performance of each FET formed. For example, the hybrid substrate allows for providing a structure in which a pFET can be formed on a (110) crystal orientation, while the nFET can be formed on a (100) crystal orientation. When a hybrid substrate is used, it may have SOI-like properties, bulk-like properties or a combination of SOI- and bulk-like properties.

In some embodiments of the present invention, at least one isolation region (not shown) is formed into the substrate 12. The at least one isolation region may include a trench isolation region, a field oxide isolation region or combinations thereof. The isolation regions are formed utilizing processing techniques well known to those skilled in the art.

The gate dielectric 18 present in each of the gate regions can comprise the same or different insulating material. For example, the gate dielectric 18 can be comprised of an oxide, nitride, oxynitride, high k material (i.e., a dielectric material having a dielectric constant that is greater than silicon dioxide) or any combination thereof including multilayers. Preferably, the gate dielectric 18 is comprised of an oxide such as, for example, $SiO_2$.

The gate electrode 20 of each of the gate regions (active and dummy) can be comprised of the same or different conductive material, including, for example, polySi, SiGe, a metal, a metal alloy, a metal silicide, a metal nitride or combinations including multilayers thereof. When multilayers are present, a diffusion barrier (not shown), such as TiN or TaN, can be positioned between each of the conductive layers. A capping layer (also not shown), such as an oxide, or nitride, can be located atop the gate electrode of each of the gate regions the presence of the capping layer can be used to prevent subsequent formation of a silicide contact on said gate electrode. The silicide contact on said gate electrode is typically formed when the gate electrode includes a Si-containing material and no capping layer is present. Preferably, the gate electrode within each of the gate regions comprises polySi or polySiGe.

The at least one spacer that is optionally present is typically comprised of an oxide, nitride or oxynitride including combinations and multilayers thereof. Although optional, typically one spacer is present in the inventive structure. In the illustrated example, a pair of spacers is shown. Typically, the inner L-shaped spacer 26 is comprised on an oxide, while the outer spacer 28 is comprised of a nitride.

As indicated above, each active gate region 16 also includes S/D regions which typically include extension regions and deep S/D diffusion regions. The source/drain regions together with the gate electrode 20 define the length of the channel in the active gate region 16. It is noted that S/D extensions and S/D diffusion regions are comprised of an upper portion of the semiconductor substrate 12 that has been doped with either n- or p-type dopants by ion implantation. The S/D extensions are typically shallower in depth than the S/D diffusion regions.

Next, and as shown in FIG. 2B, a first stress liner 30 is formed on a portion of the substrate 12 as well as covering a portion of the dummy gate region 14. The terms "first and second stress liner" are used throughout this application to denote stress inducing materials that have been deposited and patterned by lithography and etching. In accordance with the method of the present invention, the first stress liner may be a tensile stress liner or a compressive stress liner. In a preferred embodiment, and for the drawings illustrated in the present application, the first stress liner 30 is a tensile stress liner. This configuration assumes that the active gate region 16 is a pFET. A compressive stress liner would be used for the first stress liner 30 when the active gate region 16 is an nFET.

The presence of the stress liner results in stresses being introduced into the substrate 12. In the drawing, the lower case 't' denotes the tensile stress induced into the substrate by the presence of the tensile stress liner, while the lower case 'c' denotes the compressive stress induced by the presence of the tensile stress liner on the substrate 12. The dotted lines represent the zero stress lines present in the substrate. It is noted that when the first stress liner 30 is a compressive stress liner, the position of the lower case c and t would be reversed from that shown in FIG. 2B.

The first stress liner 30 is comprised of any stress inducing material such as a nitride or a high density plasma (HDP) oxide, or a combination thereof. The stress liner can formed by various chemical vapor deposition (CVD) processes such as low pressure CVD (LPCVD), plasma enhanced CVD (PECVD), rapid thermal CVD (RTCVD) or BTBAS-based ($C_8H_{22}N_2Si$ reacted with ammonia) CVD, where BTBAS is a modern metalorganic precursor for CVD application. The later process provides a low temperature nitride film having high stress. Following deposition of the stress liner material, lithography and etching are used in forming the first stress liner 30.

Preferably, the first stress liner 30 comprises a nitride, such as $Si_3N_4$, wherein the process conditions of the deposition process are selected to provide an intrinsic tensile strain within the deposited layer. For example, plasma enhanced chemical vapor deposition (PECVD) can provide nitride stress liners having an intrinsic tensile strain. The stress state (tensile or compressive) of the stress liners deposited by PECVD can be controlled by changing the deposition conditions to alter the reaction rate within the deposition chamber. More specifically, the stress state of a deposited nitride stress liner may be set by changing the deposition conditions such as: $SiH_4/N_2/He$ gas flow rate, pressure, RF power, and electrode gap.

In another example, rapid thermal chemical vapor deposition (RTCVD) can provide nitride tensile stress liners having an internal tensile strain. The magnitude of the internal tensile strain produced within the nitride tensile stress liner deposited by RTCVD can be controlled by changing the deposition conditions. More specifically, the magnitude of the tensile strain within the nitride stress liner may be set by changing deposition conditions such as: precursor composition, precursor flow rate and temperature.

FIG. 2C illustrates the structure of FIG. 2B after a second stress liner 32 is formed thereon. In accordance with the present invention, the second stress liner 32 covers a portion of the substrate 12 and the entire active gate region 16 as well as a portion of the dummy gate region 14. As shown, the second stress liner 32 extends atop a small segment of the patterned stress liner 30 such that an overlap 34 of the first and second stress liners is created atop the dummy gate region 14. In one embodiment, a compressive stress liner overlaps a segment of the tensile stress liner atop the dummy gate region 14. In another embodiment, a tensile stress liner overlaps a segment of a compressive stress liner. Additional embodiments have compressive stress liner and tensile stress liner in close proximity (within approximately 200 nm), but not directly overlapping.

Due to the location of the overlap 34, the dual stress liner boundary (surfaces of the stress liners that abut each other but do not overlap) is present atop the dummy gate region 14 as is shown in FIG. 2C. The large stress forces (represented by upper case 'T' for tensile, and by upper case "C" for compressive) generated by the dual stress liner boundary 36 are located within the dummy gate region 14, not the substrate 12 as well the case with prior art dual stress liner technology. The dotted lines in the drawing again refer to the zero stress lines.

In accordance with the method of the present invention, the second stress liner 32 may be a tensile stress liner or a compressive stress liner with the proviso that it has opposite stress sign as compared to the first stress liner 30. In a preferred embodiment, and for the drawings illustrated in the present application, the second stress liner 32 is a compressive stress liner. This configuration assumes that the active gate region 16 is pFET. A tensile stress liner would be used when the active device region 16 is an nFET.

The presence of the second stress liner 32 results in stress being introduced into the substrate 12. In the drawing, the upper case 'C' denotes the compressive stress induced by the presence of the second compressive stress liner on the substrate 12. The dotted lines in the drawing again refer to the zero stress lines.

The second stress liner 32 is formed utilizing the same basic processing steps as the first stress liner 30. Hence, deposition, lithography and etching are used in forming the second stress liner 32. The second stress liner is comprised of the same or different stress inducing materials as mentioned above for the first stress liner 30.

Figure 4:
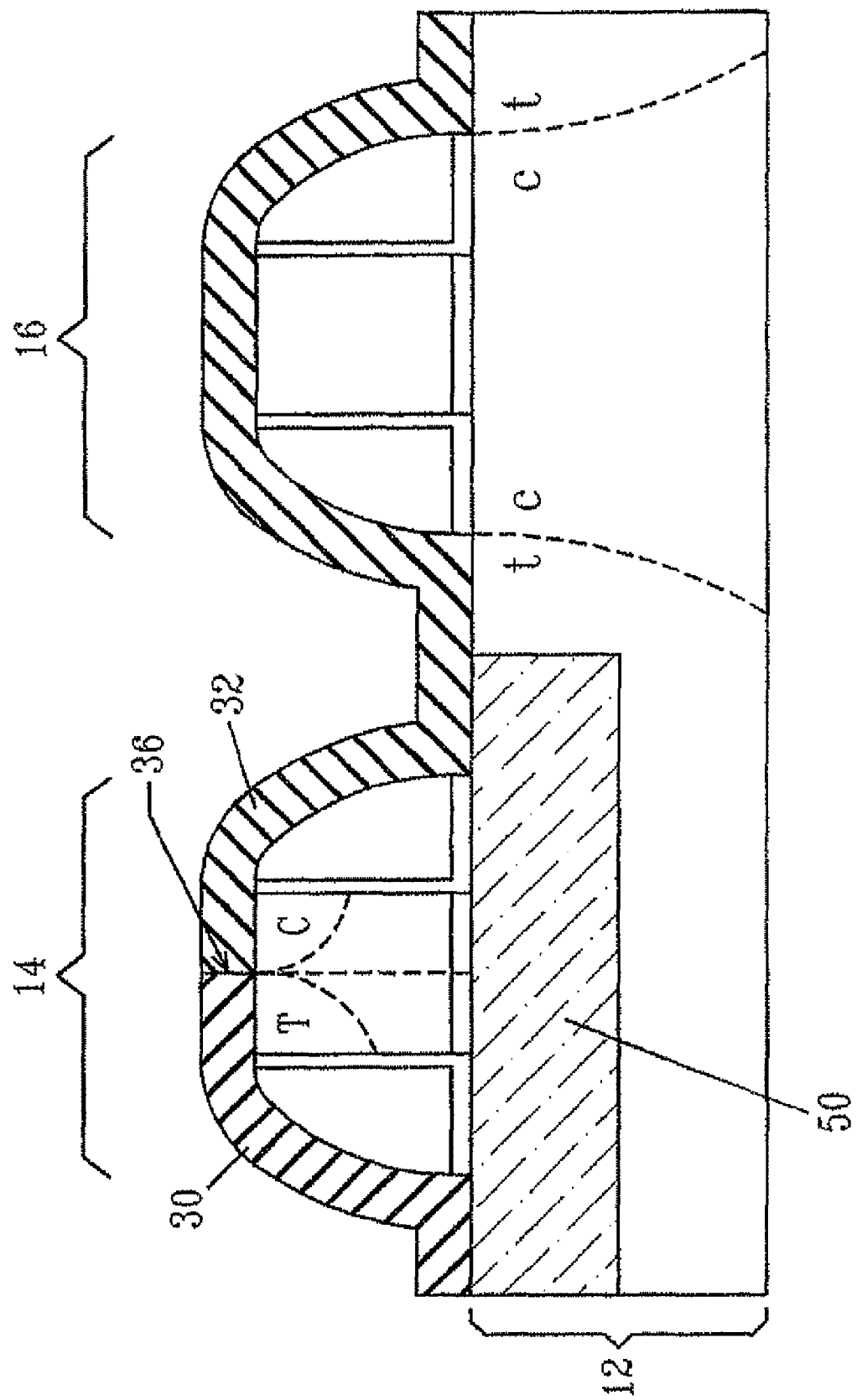
FIG. 4 is a pictorial representation (through a cross sectional view) depicting another alternative structure of the present application.
Figure 5:
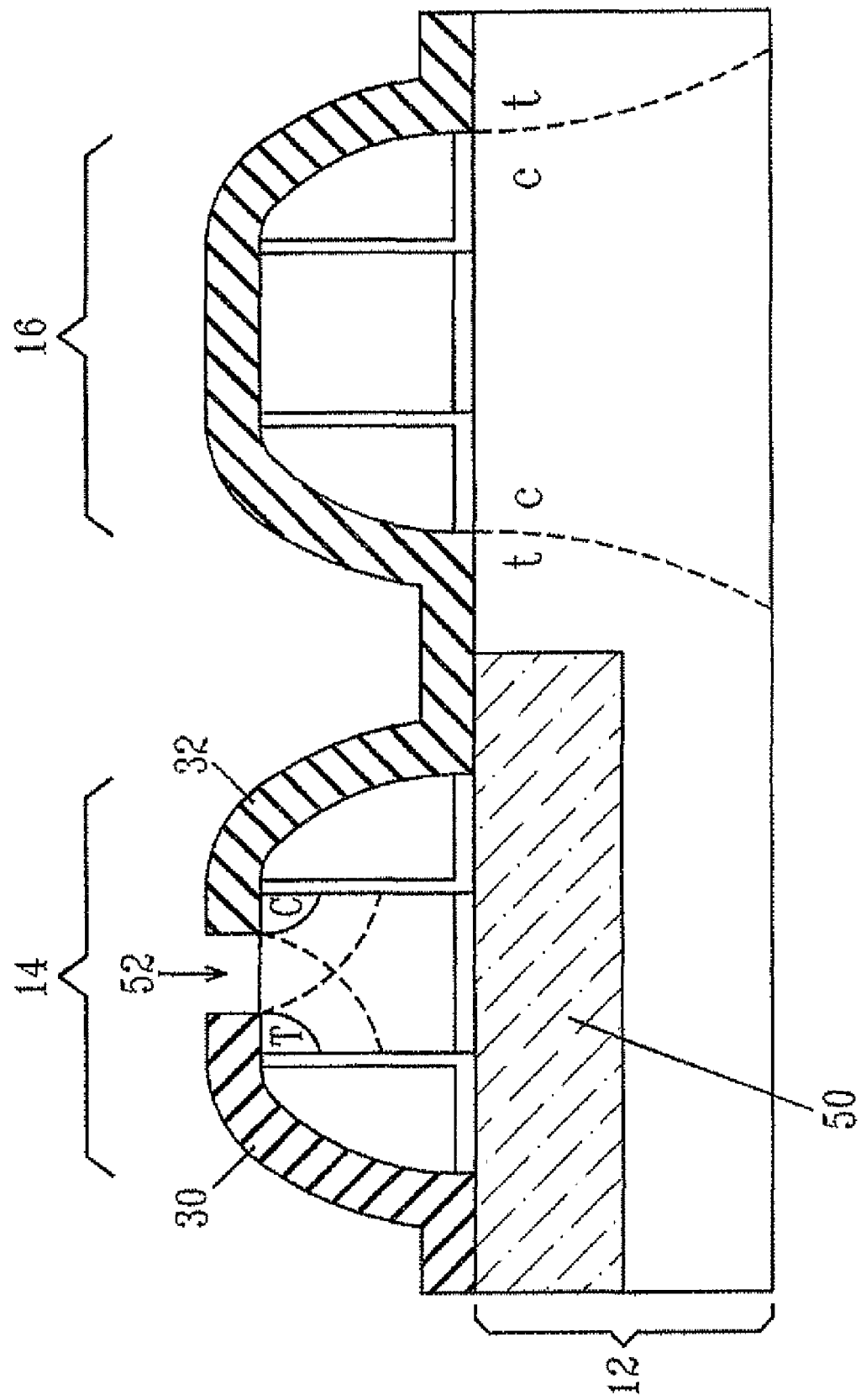
FIG. 5 is a pictorial representation (through a cross sectional view) depicting yet another alternative structure of the present application.

FIG. 3 shows an alternative structure that can be formed by modifying the basic description provided above for FIGS. 2A-2C. In the structure illustrated in FIG. 3 the dummy gate is formed atop an isolation region 50 such as a trench isolation region. The isolation region 50 is formed into the substrate 12 utilizing techniques that are well known to those skilled in the art. For example, a trench isolation region can be formed by first providing a trench into the substrate by lithograpy and etching, the trench is then filled with a trench dielectric material, typically a trench oxide, and a planarization process is then performed. It is noted that although this structure includes overlapped stress liners atop the dummy gate region, neither the invention nor this embodiment is limited to the same. Instead, the stress liners may be perfectly abutted to each other over the dummy gate region (as shown in FIG. 4) or a gap 52 may be present between the stress liners atop the dummy gate region (as shown in FIG. 5). These alternative structures can of course be used in conjugation with the embodiment depicted in FIGS. 2A-2C.

In addition to the above embodiments and alternative structures, the present invention also contemplates an embodiment wherein one of the stress liners is removed from the structure such that a single stress liner is present in which the single stress liner has an edge that lands atop the dummy gate region. For example, a system in which a tensile stress liner is deposited but removed from a pFET; no compressive liner is used.

As indicated above, the present invention provides a method and semiconductor structure that overcomes the dual stress liner boundary problem, without significantly increasing the overall size of the integrated circuit. This is achieved in the present invention by ensuring that the dual stress liner boundary between tensile and compressive stress liners is forced to land on a neighboring dummy gate region. By forcing the dual stress liner boundary to land on the dummy gate region, the large stresses associated with the dual stress liner boundary are transferred to the dummy gate region, not directly to the semiconductor substrate. Thus, the impact of the dual stress liner boundary on the nearest neighboring FET is reduced. Additionally, benefits of device variability and packing density are achieved utilizing the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a semiconductor substrate having at least one dummy gate region in proximity to at least one FET; and a tensile stress liner or a compressive stress liner located on said substrate, wherein said stress liner covers the at least one FET and is present in part over said at least one dummy gate region such that an etched edge of the stress liner lands on top of said at least one dummy gate region.

2. A semiconductor structure comprising:
a semiconductor substrate having at least one dummy gate region in proximity to at least one nFET; and
a tensile stress liner and a compressive stress liner located on said substrate, wherein said tensile stress liner covers the at least one nFET and is present in part over said at least one dummy gate region such that an boundary or gap exists between the stress liners that lands on top of said at least one dummy gate region.

3. The semiconductor structure of claim 2 wherein stress liners overlap each other atop the dummy gate region.

4. The semiconductor structure of claim 2 wherein stress liners abut each other atop the dummy gate region or a space is located between the two stress liners atop the dummy gate region.

5. The semiconductor structure of claim 2 wherein said dummy gate region is located atop an isolation region that is located within or on said semiconductor substrate.

6. A semiconductor structure comprising:
a semiconductor substrate having at least one dummy gate region in proximity to at least one pFET; and
a tensile stress liner and a compressive stress liner located on said substrate, wherein said compressive stress liner covers the at least one pFET and is present in part over said at least one dummy gate region such that a boundary or gap exists between the stress liners that lands on top of said at least one dummy gate region.

7. The semiconductor structure of claim 6 wherein stress liners overlap each other atop the dummy gate region.

8. The semiconductor structure of claim 6 wherein stress liners abut each other atop the dummy gate region or a space is located between the two stress liners atop the dummy gate region.

9. The semiconductor structure of claim 6 wherein said dummy gate region is located atop an isolation region that is located within or on said semiconductor substrate.

10. A semiconductor structure comprising:
a semiconductor substrate having at least one dummy gate region in proximity to at least one active gate region; and
a tensile stress liner and a compressive stress liner located on said substrate, wherein said tensile stress liner and said compressive stress liner are present in part over said at least one dummy gate region such that a boundary or gap exists between the stress liners that lands on top of said at least one dummy gate region.

11. The semiconductor structure of claim 10 wherein said semiconductor substrate comprises a Si-containing substrate having a single crystal orientation.

12. The semiconductor structure of claim 10 wherein said semiconductor substrate is a hybrid substrate including surface regions of different crystal orientations, wherein each active gate region is disposed on a crystal orientation that provides optimal device performance.

13. The semiconductor structure of claim 10 wherein said compressive stress liner covers said at least one active gate region and overlaps a segment of the tensile stress liner atop said dummy gate region.

14. The semiconductor structure of claim 13 wherein said at least one active gate region is a pFET.

15. The semiconductor structure of claim 10 wherein said tensile stress liner covers said at least one active gate region and overlaps a segment of the compressive stress liner atop said dummy gate region.

16. The semiconductor structure of claim 15 wherein said at least one active gate region is an nFET.

17. The semiconductor structure of claim 10 wherein said stress liners abut each other, over said dummy gate region or a space is present there between.

18. The semiconductor structure of claim 10 wherein said dummy gate region is located atop an isolation region that is located within or on said semiconductor substrate.

19. A method of forming a semiconductor structure comprising:
providing a semiconductor substrate having at least one dummy gate region in proximity to at least one active gate region; and
disposing, in any order, a tensile stress liner and a compressive stress liner on said substrate, wherein said tensile stress liner and said compressive stress liner are present in part over said at least one dummy gate region such that a boundary or gap exists between the stress liners that lands on top of said at least one dummy gate region.

20. The method of claim 19 wherein said tensile stress liner is disposed first followed by said compressive stress liner thereby said compressive stress liner covers said at least one active gate region and overlaps a segment of the tensile stress liner atop said dummy gate region.

21. The method of claim 19 wherein said compressive stress liner is disposed first followed by said tensile stress liner thereby said tensile stress liner covers said at least one active gate region and overlaps a segment of the compressive stress liner atop said dummy gate region.

22. The method of claim 19 wherein said disposing comprises deposition, lithography and etching.

23. The method of claim 22 wherein said deposition comprises a chemical vapor deposition process selected from the group consisting of low pressure chemical vapor deposition, plasma enhanced chemical vapor deposition, rapid thermal chemical vapor deposition, and BTBAS-based chemical vapor deposition.

24. The method of claim 19 wherein semiconductor substrate is a hybrid substrate including surface regions of different crystal orientations, wherein each active gate region is disposed on a crystal orientation that provides optimal device performance.

25. The method of claim 19 wherein each dummy gate region comprises a stack including, from bottom to top, a gate dielectric and a gate electrode.

26. The method of claim 19 wherein each active gate region comprises a stack including, from bottom to top, gate dielectric and a gate electrode, a channel region between said stack and adjoining source/drain regions.

27. The method of claim 19 wherein stress liners abut each other atop the dummy gate region or a space is located between the two stress liners atop the dummy gate region.

28. The method of claim 19 wherein said dummy gate region is located atop an isolation region that is located within or on said semiconductor substrate.

* * * * *